(12) United States Patent
Sasaki et al.

(10) Patent No.: US 7,467,513 B2
(45) Date of Patent: Dec. 23, 2008

(54) EXHAUST EMISSION CONTROL SYSTEM

(75) Inventors: Toshitake Sasaki, Toyota (JP); Kiyohito Murata, Susono (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 695 days.

(21) Appl. No.: 10/957,725

(22) Filed: Oct. 5, 2004

(65) Prior Publication Data

US 2005/0072142 A1    Apr. 7, 2005

(30) Foreign Application Priority Data

Oct. 6, 2003 (JP) ............... P2003-347245
Jan. 20, 2004 (JP) ............... P2004-012256

(51) Int. Cl.
*F01N 3/02* (2006.01)

(52) U.S. Cl. .............. 60/320; 60/287; 60/298; 60/300; 422/109; 422/199; 136/204; 136/205

(58) Field of Classification Search ........... 60/274, 60/284, 298, 299, 300, 320, 287; 136/204, 136/205, 208; 422/173, 174, 177
See application file for complete search history.

(56) References Cited

U.S. PATENT DOCUMENTS

| | | | | |
|---|---|---|---|---|
| 3,881,962 | A * | 5/1975 | Rubinstein | 136/209 |
| 5,968,456 | A * | 10/1999 | Parise | 422/174 |
| 6,986,247 | B1 * | 1/2006 | Parise | 60/284 |
| 7,051,522 | B2 * | 5/2006 | Yang et al. | 60/320 |
| 7,100,369 | B2 * | 9/2006 | Yamaguchi et al. | 60/324 |
| 7,150,147 | B2 * | 12/2006 | Murata | 60/287 |
| 7,178,332 | B2 * | 2/2007 | Sasaki | 60/320 |
| 7,405,013 | B2 * | 7/2008 | Yang et al. | 429/13 |

2003/0223919 A1 * 12/2003 Kwak et al. ............... 422/174

FOREIGN PATENT DOCUMENTS

| | | |
|---|---|---|
| DE | 199 46 806 A1 | 4/2001 |
| JP | 6-98477 | 4/1994 |

(Continued)

OTHER PUBLICATIONS

European Search Report dated Jan. 27, 2005.

(Continued)

*Primary Examiner*—Tu M Nguyen
(74) *Attorney, Agent, or Firm*—Finnegan, Henderson, Farabow, Garrett & Dunner, LLP

(57) ABSTRACT

An exhaust emission control system.

A generator has a thermoelectric conversion element for achieving thermoelectric conversion by making use of heat of exhaust gas. An exhaust purifying catalyst disposed in the generator or on the exhaust downstream side of the generator, and a heat conduction varying device make heat conduction from the exhaust gas to the thermoelectric conversion element variable between a high conduction state and a low conduction state. When a temperature of the exhaust purifying catalyst is higher than a predetermined temperature, the heat conduction varying device varies the heat conduction from the exhaust gas to the thermoelectric conversion element into the high conduction state. This permits the system to efficiently re-collect thermal energy from the exhaust gas and convert it into electric energy, without increase in a time to arrival of the exhaust purifying catalyst at an activation temperature thereof.

3 Claims, 15 Drawing Sheets

| | FOREIGN PATENT DOCUMENTS | |
|---|---|---|
| JP | 10-309088 | 11/1998 |
| JP | 2000-035824 | 2/2000 |
| JP | 2000-297632 | 10/2000 |
| JP | 2000-312035 | 11/2000 |
| WO | WO 2004/059138 A1 | 7/2004 |
| WO | WO 2004/059139 A1 | 7/2004 |

OTHER PUBLICATIONS

Patent Abstract 2000-035824, published Feb. 2, 2000.
Patent Abstract 2000-0352313, published Dec. 19, 2000.
Patent Abstract 11-036981, published Feb. 9, 1999.

* cited by examiner

Fig.3
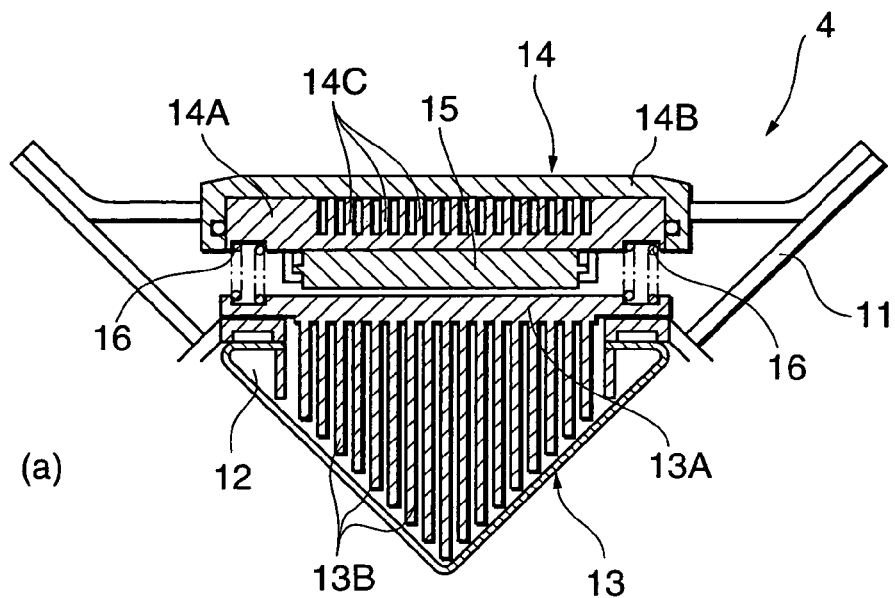
(a)
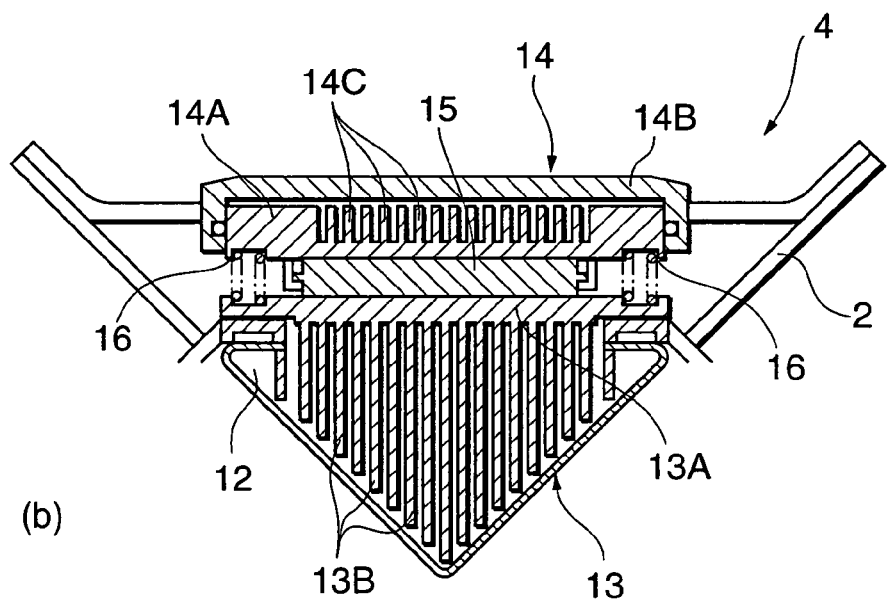
(b)

Fig.5
(a)
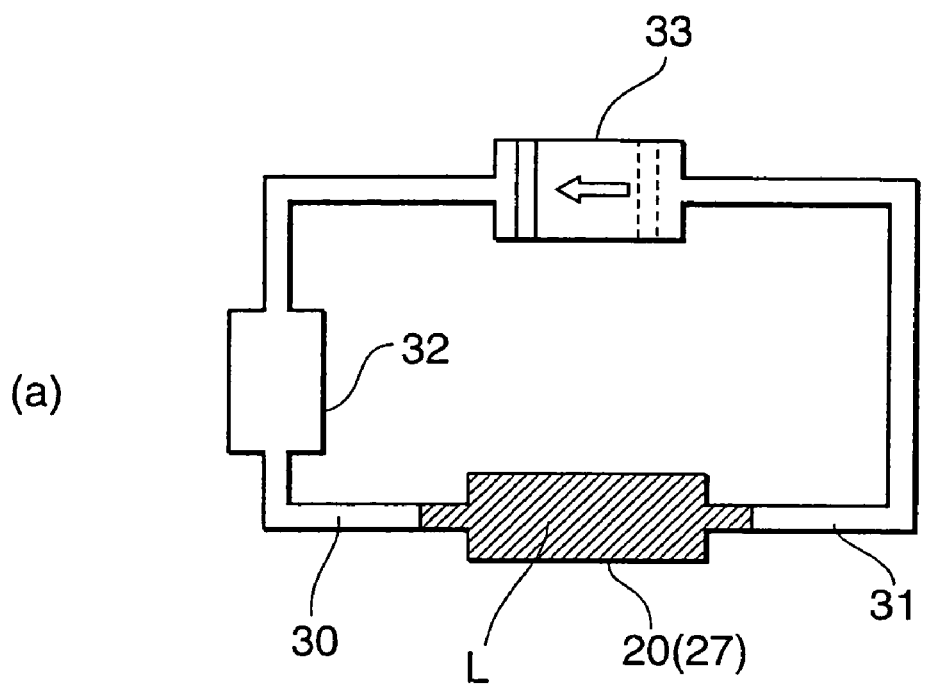
(b)
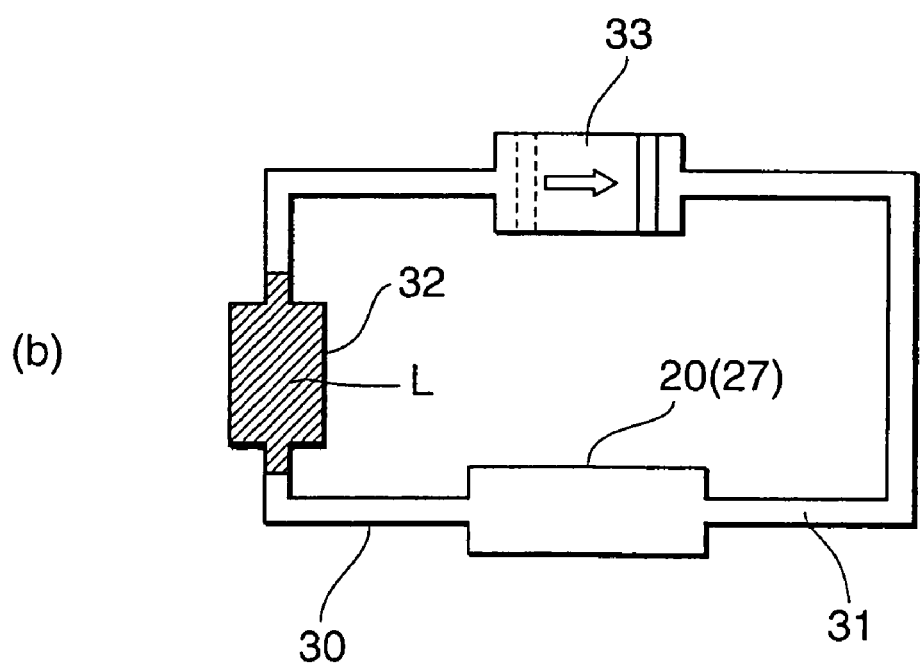

Fig.11
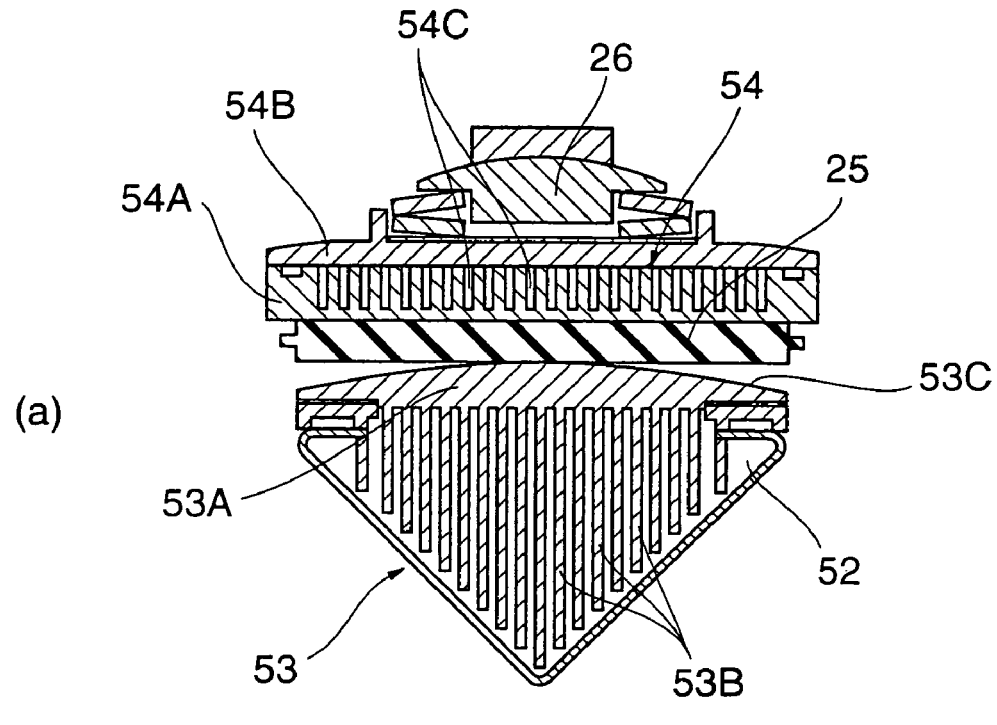
(a)
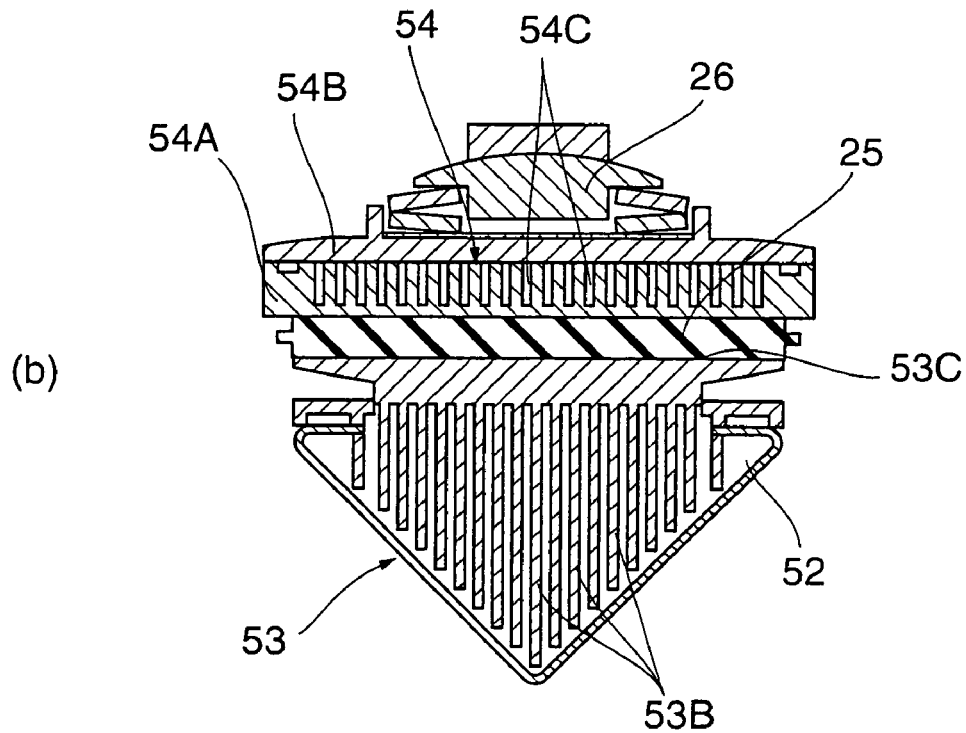
(b)

Fig.12
(a)
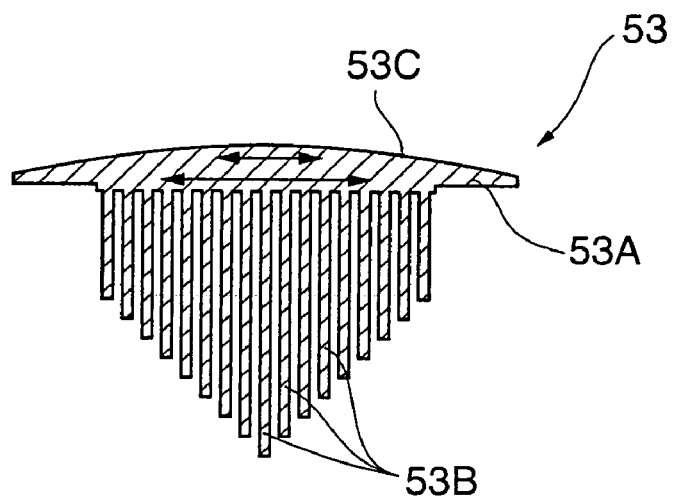
(b)
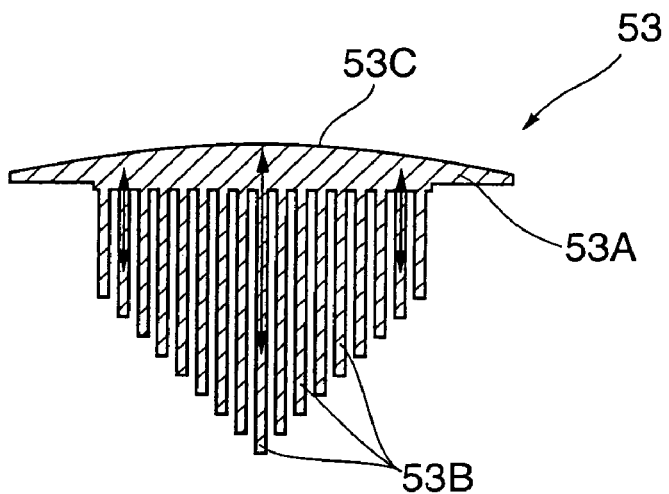
(c)
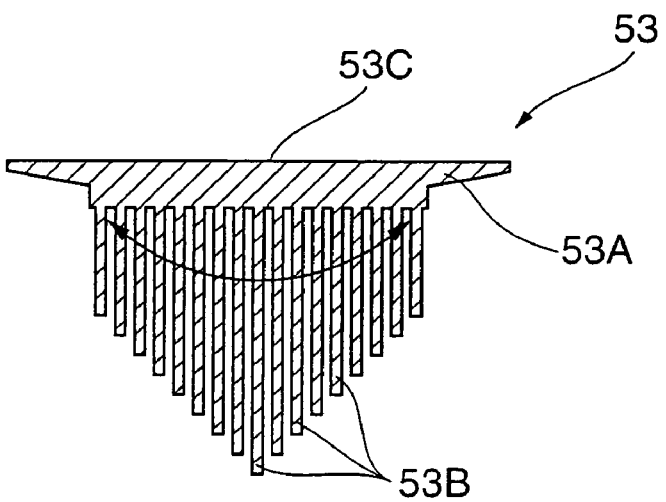

Fig.14
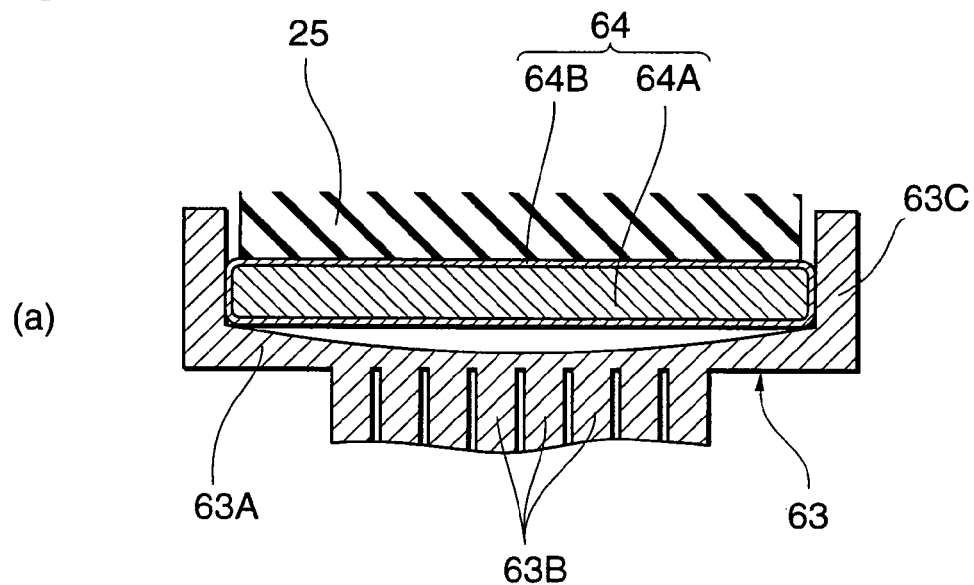
(a)
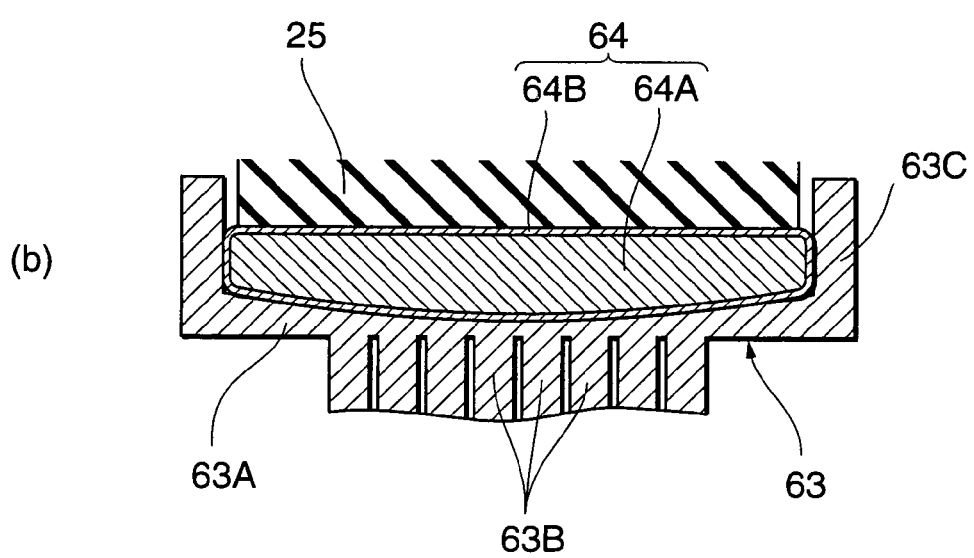
(b)

EXHAUST EMISSION CONTROL SYSTEM

BACKGROUND OF THE INVENTION

1. Field of the Invention

The present invention relates to an exhaust emission control system having a generator for converting thermal energy of exhaust into electric energy, and an exhaust purifying catalyst.

2. Related Background Art

Exhaust gas from an automobile engine possesses thermal energy and discharge of exhaust gas results in wasting energy. There is thus an electric generator configured to convert the thermal energy of exhaust gas into electric energy to charge a battery. An example of such generator is disclosed in Japanese Patent Application Laid-Open No. 2000-35824.

This generator has a thermoelectric conversion element provided on an exhaust pipe, and a bimetallic element as a thermal connection means for conducting heat from the exhaust pipe to the thermoelectric conversion element. While the temperature of the exothermic member (exhaust pipe) is below an allowable temperature limit of the thermoelectric conversion element, the bimetallic element stays undeformed to conduct the heat of the exothermic member (exhaust pipe) to the thermoelectric conversion element. Conversely, while the temperature of the exothermic member exceeds the allowable temperature limit, the bimetallic element is deformed to break the mechanical contact between the exothermic member and the thermoelectric conversion element so as to interrupt the thermal conduction.

The recent automobiles are provided with an exhaust purifying catalyst on the exhaust pipe, in order to eliminate carbon oxide and others from exhaust gas. Its purifying function of this catalyst is exerted at temperatures of more than its activation temperature. It can be contemplated to construct an exhaust emission control system in a configuration wherein the generator as described above is mounted on the automobile exhaust pipe and wherein the catalyst is provided downstream thereof.

In the exhaust emission control system with the generator and the catalyst in this configuration, however, the generator performs the generating operation even during periods in which the catalyst is below the activation temperature, e.g., right after starting an engine. If the heat in exhaust gas is used for generation of electricity, there will arise a problem that the time to arrival of the catalyst at the activation temperature becomes longer, so as to delay the exertion of the purifying action.

SUMMARY OF THE INVENTION

An object of the present invention is therefore to provide an exhaust emission control system capable of efficiently converting thermal energy of exhaust gas into electric energy, without slowing the arrival of the catalyst at the activation temperature.

An exhaust emission control system of the present invention comprises a generator which has a thermoelectric conversion element for generating electricity by thermoelectric conversion utilizing heat of exhaust gas from an engine. A catalyst is disposed in the generator or downstream thereof. The exhaust emission control system of the present invention also comprises heat conduction varying means for making heat conduction from the exhaust gas to the thermoelectric conversion element variable between a high conduction state and a low conduction state. When a temperature of the catalyst is higher than a temperature set based on an activation temperature of the catalyst, the heat conduction varying means makes prominent the heat conduction from the exhaust gas to the thermoelectric conversion element.

The exhaust emission control system according to the present invention comprises the heat conduction varying means for making the heat conduction to the thermoelectric conversion element variable, and is configured to keep the heat conduction in the high conduction state when the temperature is higher than a predetermined temperature (the activation temperature of the catalyst or the temperature set based on the activation temperature). For this reason, the amount of heat conducted to the thermoelectric conversion element is kept small before activation of the catalyst, whereby the catalyst can quickly reach the activation temperature. After the catalyst is activated, the heat conduction to the thermoelectric conversion element is switched into the high conduction state, whereby the thermal energy of exhaust gas can be efficiently re-collected to be converted into electric energy.

The heat conduction varying means comprises a heat re-collector for re-collecting the heat of the exhaust gas, and a coolant path. The heat re-collector and the coolant path are placed on respective sides of the thermoelectric conversion element. The thermoelectric conversion element can be constructed in a configuration wherein it is arranged movable relative to the heat re-collector, is brought into contact with the heat re-collector with introduction of a coolant into the coolant path, and is separated apart from the heat re-collector without introduction of the coolant into the coolant path.

In the generator, the thermoelectric conversion element performs the thermoelectric conversion with introduction of the coolant into the coolant path. For this reason, the heat conduction turns into the high conduction state upon introduction of the coolant into the coolant path, whereby the heat conduction can be kept in the high conduction state during heat re-collection.

The heat conduction varying means comprises a heat re-collector for re-collecting the heat of the exhaust gas, and the heat re-collector has a heat medium receptacle. It is also possible to adopt a configuration wherein the heat conduction is maintained in the high conduction state while a heat medium is retained in the heat medium receptacle and wherein the heat conduction is maintained in the low conduction state while the heat medium is not retained in the heat medium receptacle. In this manner, the heat conduction can be readily made variable between the high conduction state and the low conduction state by retaining the heat medium in the heat medium receptacle or by removing the heat medium from the heat medium receptacle.

Furthermore, the heat conduction varying means comprises a heat re-collector for re-collecting the heat of the exhaust gas. The heat re-collector is disposed around an exhaust path in which the exhaust gas flows. Furthermore, the thermoelectric conversion element is disposed in a state of contact with the heat re-collector and along the periphery of the heat re-collector. It is also possible to adopt a configuration wherein the thermoelectric conversion element and the exhaust path are arranged to be able to be separated from each other by pulling the thermoelectric conversion element to rotate the thermoelectric conversion element around a fulcrum at one end of the thermoelectric conversion element, wherein the heat conduction is in the high conduction state while the thermoelectric conversion element and the heat re-collector are kept in contact with each other, and wherein the heat conduction is in the low conduction state while the thermoelectric conversion element and the heat re-collector are separated from each other. This mechanical structure can also make the heat conduction readily variable between the high conduction state and the low conduction state.

It is also possible to adopt a configuration wherein the heat conduction varying means comprises a heat re-collector for re-collecting the heat of the exhaust gas, wherein a contact surface of the heat re-collector with the thermoelectric conversion element is deformable, and wherein a contact area of the contact surface with the thermoelectric conversion element becomes larger in a high heat state than in a low heat state of the heat re-collector. By making use of the deformation of the contact surface in this manner, it is feasible to readily make the conduction state variable between the high conduction state and the low conduction state.

In this configuration, the contact surface can be so constructed that it becomes flat when the contact area of the heat re-collector with the thermoelectric conversion element is large and that it becomes curved when the contact area is small. By shaping the contact surface in this manner, it is feasible to readily switch the conduction state between the high conduction state and the low conduction state.

Furthermore, it is also possible to adopt a configuration wherein the heat conduction varying means comprises a heat re-collector for re-collecting the heat of the exhaust gas, wherein a hardness change material is disposed between the heat re-collector and the thermoelectric conversion element, wherein the heat conduction is in the high conduction state between the heat re-collector and the thermoelectric conversion element in a soft state of the hardness change material, and wherein the heat conduction is in the low conduction state between the heat re-collector and the thermoelectric conversion element in a hard state of the hardness change material. By using the hardness change material of this kind, it is also feasible to readily make the heat conduction variable between the high conduction state and the low conduction state.

In this case, it is possible to adopt a configuration wherein the hardness change material is formed so that a phase change material is retained in a flexible case. By using the phase change material in the flexible case, it is feasible to readily form the hardness change material.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 3 is a cross-sectional plan view showing states of a thermoelectric conversion module and a heat conductor.

FIG. 5 is a block diagram showing states in which oil is retained in an oil receptacle in a generator, or in an oil reservoir.

FIG. 11 is an illustration showing a modified form of a fin member in a generator.

FIG. 12 is an illustration for illustrating a principle of deformation of a fin member in a generator.

FIG. 14 is a sectional view showing states of deformation of a buffer pad in a generator.

DESCRIPTION OF THE PREFERRED EMBODIMENTS

The preferred embodiments of the present invention will be described below with reference to the drawings. Throughout the embodiments, parts having the same functionality will be denoted by the same reference symbols, without redundant description thereof.

Figure 1:
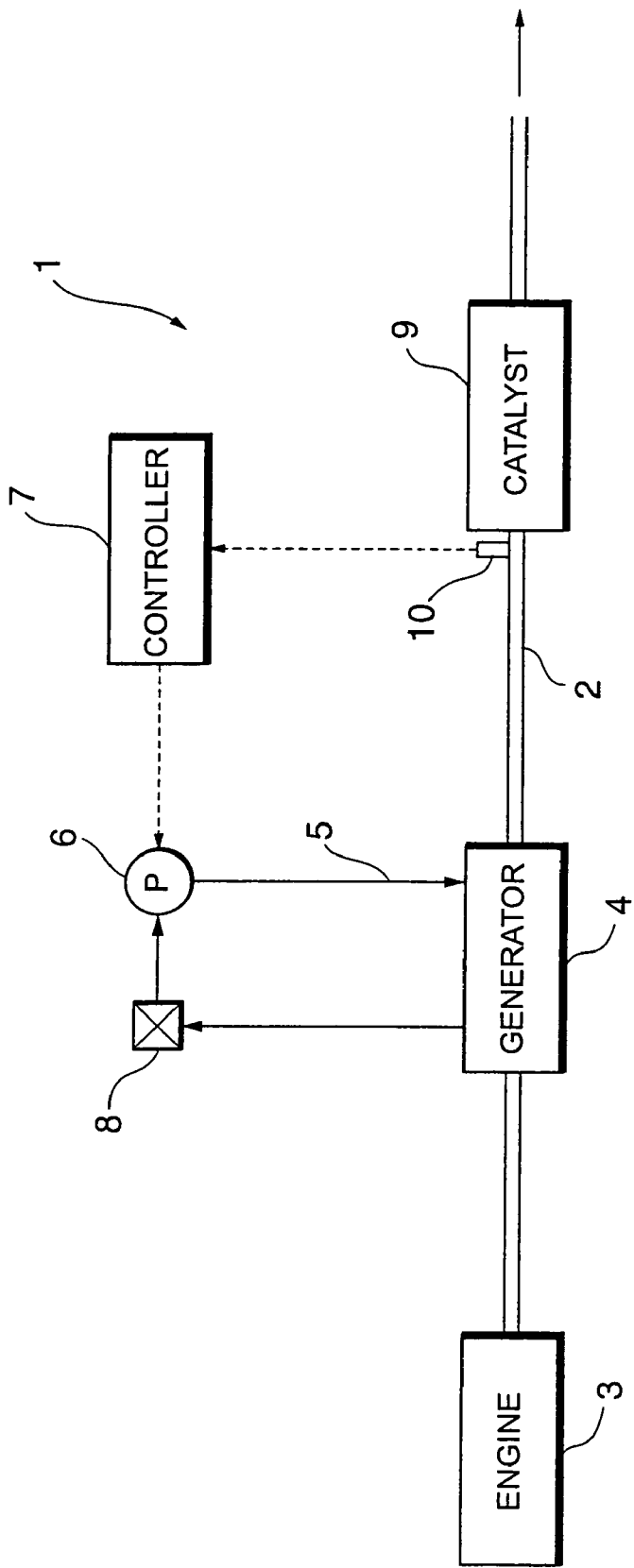
FIG. 1 is a block configuration diagram of an exhaust emission control system according to an embodiment of the present invention.
Figure 2:
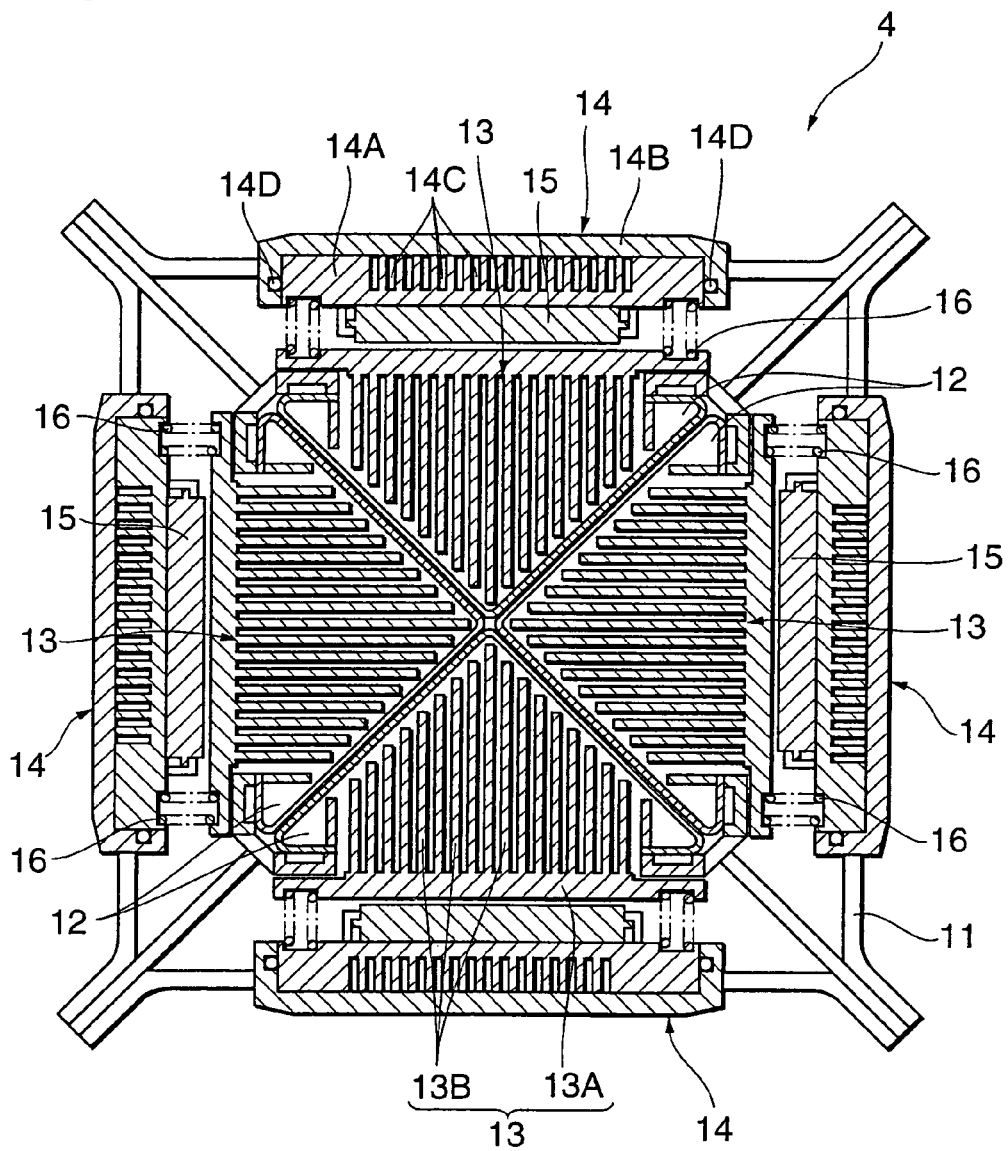
FIG. 2 is a cross-sectional plan view of a generator.

FIG. 1 is a block diagram of an exhaust emission control system according to an embodiment of the present invention, and FIG. 2 is a cross-sectional plan view of a generator (a cross section by a plane perpendicular to the flow of exhaust gas).

As shown in FIG. 1, the exhaust emission control system 1 of the present embodiment has an exhaust pipe 2. The exhaust pipe 2 is connected to an engine 3, and exhaust gas from the engine 3 flows in the exhaust pipe 2 to be discharged from an unrepresented muffler to the outside.

A generator 4 is provided midway on the exhaust pipe 2. The generator 4 converts thermal energy of exhaust gas into electric energy. A pump 6 for circulating a coolant through a coolant pipe 5 is connected to the generator 4, and a controller 7 is electrically connected to the pump 6.

The controller 7 controls the pump 6 while determining whether the pump 6 is to be driven, based on the temperature of exhaust gas or the like. The coolant pipe 5 is provided with a heat exchanger 8. The heat exchanger 8 cools the heated coolant by heat exchange.

Furthermore, an exhaust purifying catalyst 9 is provided downstream of the generator 4 on the exhaust pipe 2. The catalyst 9 is a three way catalyst and cleans up substances such as nitrogen oxides, carbon monooxide, and hydrocarbons in the exhaust gas. The exhaust pipe 2 is equipped with a temperature sensor 10. The temperature sensor 10 detects the temperature of the exhaust gas flowing in the exhaust pipe 2 and outputs the detected temperature to the controller 7.

The generator 4 is provided with a housing 11, as shown in FIG. 2, and four exhaust paths 12 are formed in the housing 11. The exhaust gas from the engine 3 shown in FIG. 1 flows through the four exhaust paths 12 to be discharged toward the catalyst 9. Each exhaust path 12 is provided with a fin member 13 for re-collecting the thermal energy from the exhaust gas. The fin member 13 serves as a heat re-collector. The fin member 13 is comprised of a heat conductor 13A and fins 13B, and the fins 13B extend from the heat conductor 13A. These heat conductor 13A and fins 13B are integrally formed by extrusion or the like.

Coolant cases 14 are mounted at respective locations corresponding to the fin members 13, in an outer casing of the housing 11, and each coolant case 14 is comprised of an inner frame 14A and an outer frame 14B. The outer frame 14B is fixed to the outer casing of the housing 11. The inner frame 14A is movable relative to the outer frame 14B.

Coolant paths 14C are formed in each inner frame 14A and the coolant supplied from the coolant pipe 5 shown in FIG. 1 flows in the coolant paths 14C. As the coolant flows in the coolant paths 14C, the inner frame 14A moves toward the fin member 13. A sealing member 14D is provided at a location on the interior side of the outer frame 14B where the inner frame 14A slides. The sealing member 14D prevents the coolant from flowing out to the outside.

A thermoelectric conversion module 15 which is a thermoelectric conversion element of the present invention is mounted on the interior side of each inner frame 14A (on the side of the heat conductor 13A of the fin member 13 opposite to the outer frame 14B). The thermoelectric conversion module 15 is an element for converting thermal energy into electric energy by making use of the so-called Seebeck effect. Namely, the thermoelectric conversion module 15 uses a temperature difference to effect thermoelectric conversion and the larger the temperature difference, the more it can generate electricity (or convert thermal energy into electric energy). As the coolant flows in the coolant paths 14C to move the inner frame 14A toward the fin member 13, the thermoelectric conversion module 15 also moves in the same direction so that the thermoelectric conversion module 15 comes into contact with the fin member 13. In this manner, the coolant cases 14 form the heat conduction varying means of the present invention.

Furthermore, a spring 16 is mounted between the peripheral region of the heat conductor 13A of each fin member 13 and the inner frame 14A of each coolant case 14. The spring 16 is located around the thermoelectric conversion module 15. The spring 16 biases the heat conductor 13A in the fin member 13 and the inner frame 14A of the coolant case 14 in mutually departing directions.

The operation and action of the exhaust emission control system of the present embodiment having the above configuration will be described below.

In the exhaust emission control system 1 of the present embodiment, the engine 3 emits exhaust gas during operation of the engine 3. The emitted exhaust gas flows through the exhaust pipe 2 to pass the generator 4 and to reach the catalyst 9. This catalyst 9 cleans up the exhaust gas. However, if the temperature of the catalyst 9 is low under an activation temperature thereof, the catalyst 9 will fail to fully fulfill the cleanup performance. The catalyst 9 is in a low temperature state, e.g., immediately after a start of the engine 3. If the generator 4 operates to re-collect the heat of the exhaust gas in this state, it will take a long time to bring the catalyst 9 into an activated state.

In the exhaust emission control system 1 of the present embodiment, a threshold of a predetermined temperature is set based on the activation temperature of the catalyst 9. Specifically, the activation temperature is used as a threshold. The activation temperature is determined depending upon the catalyst 9. The controller 7 estimates the temperature of the catalyst 9, based on the temperature of the exhaust gas outputted from the temperature sensor 10, and compares the temperature of the catalyst 9 with the activation temperature.

When the comparison result is that the temperature of the catalyst 9 is below the activation temperature, the controller 7 outputs a stop signal to the pump 6 to deactivate the pump 6, thereby keeping the coolant from being supplied to the generator 4 (or from being circulated). While the coolant is not supplied to the generator 4, as shown in FIG. 3(a), the thermoelectric conversion module 15 is located apart from the heat conductor 13A of each fin member 13 by the elastic force of the spring 16.

As the thermoelectric conversion module 15 is located apart from the heat conductor 13A of the fin member 13, only little heat is conducted to the thermoelectric conversion module 15 even with flow of the exhaust gas through the exhaust path 12. As a result, no heat re-collection is effected from the exhaust gas, so that the exhaust gas flows to the catalyst 9 while keeping its high temperature. Therefore, the exhaust gas with large amount of heat is supplied to the catalyst 9, whereby the catalyst 9 can reach the activation temperature within a short period of time.

On the other hand, when the temperature of the catalyst 9 estimated by the controller 7 is not less than the activation temperature, the controller 7 outputs an activation signal to the pump 6 to activate the pump 6, thereby circulating and supplying the coolant into the coolant cases 14 of the generator 4. As the coolant is supplied into each coolant case 14, as shown in FIG. 3(b), the inner frame 14A in the coolant case 14 moves toward the fin member 13 against the elastic force of the spring 16. With this movement of the inner frame 14A, the thermoelectric conversion module 15 also moves toward the fin member 13, so that the thermoelectric conversion module 15 comes into contact with the heat conductor 13A of the fin member 13.

While the thermoelectric conversion module 15 is in contact with the heat conductor 13A of the fin member 13, the fins 13B re-collect the heat from the exhaust gas and transfer the heat to the thermoelectric conversion module 15. The thermoelectric conversion module 15 efficiently converts thermal energy into electric energy by making use of the large temperature difference between the fin member 13 and the coolant case 14 (the difference between the temperature of the heat conductor 13A heated by the heat of the exhaust gas and the temperature of the inner frame 14A cooled by the coolant) and supplies the electric energy to an unrepresented battery or the like.

The exhaust gas after the heat re-collection by the fins 13B has a reduced amount of heat, and a lower temperature. For this reason, the exhaust gas is at a low temperature and in a low thermal energy state when arriving at the catalyst 9. However, since the catalyst 9 has already reached the activation temperature, it can fully demonstrate its cleanup performance. Accordingly, the system is able to efficiently re-collect the heat in the exhaust gas.

In this manner, the exhaust emission control system 1 of the present embodiment is constructed in such a configuration that when the temperature of the catalyst 9 does not reach the activation temperature, the heat of the exhaust gas is preferentially supplied to the catalyst 9 and that when the temperature of the catalyst 9 reaches the activation temperature, the heat re-collection by the generator 4 is preferentially carried out. Therefore, the system is able to efficiently convert the thermal energy of exhaust gas into the electric energy, without slowing the arrival of the catalyst 9 at the activation temperature.

The present embodiment uses the activation temperature itself as the threshold of the predetermined temperature set based on the activation temperature of the catalyst 9, but it is also possible to set a temperature a little lower than the activation temperature, or a temperature a little higher than the activation temperature. The present embodiment estimates the temperature of the catalyst 9 from the temperature of the exhaust gas, but it is also possible to adopt a configuration of estimating the temperature of the catalyst 9 from an operation condition and/or an operation period of the engine. Of course, it is also possible to directly detect the temperature of the catalyst 9.

Figure 4:
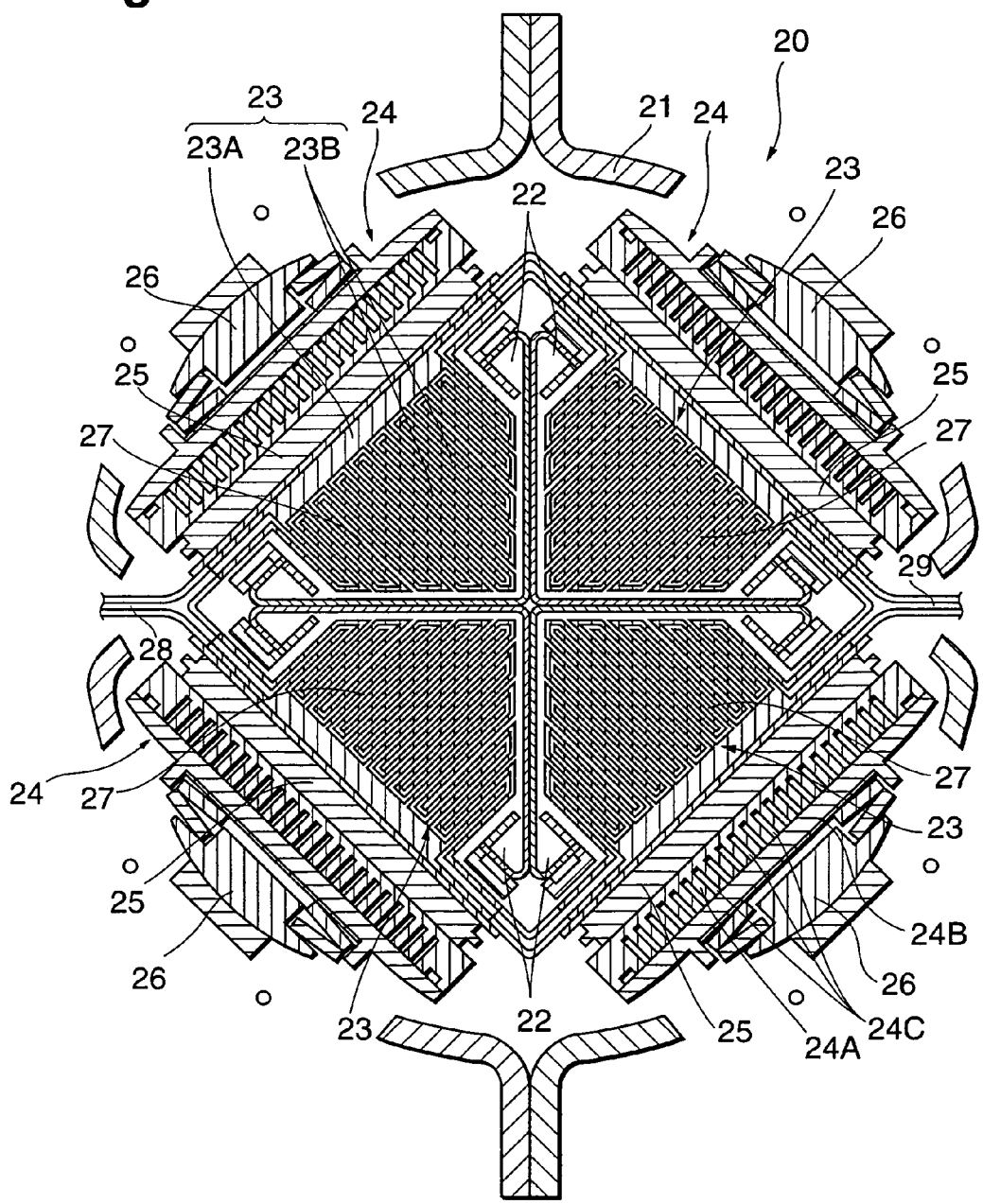
FIG. 4 is a cross-sectional plan view of a generator in an exhaust emission control system according to a second embodiment.

The second embodiment of the present invention will be described below. The exhaust emission control system of the present embodiment is different in the structure of the generator from the first embodiment and has much the same configuration as the one shown in FIG. 1, in the other respects. FIG. 4 is a cross-sectional plan view of the generator in the exhaust emission control system according to the second embodiment of the present invention.

As shown in FIG. 4, the generator 20 in the exhaust emission control system of the present embodiment has a housing 21, and four exhaust paths 22 are formed in the housing 21. Each exhaust path 22 is provided with a fin member 23 for re-collecting the thermal energy from the exhaust gas. The fin member 23 is comprised of a heat conductor 23A and fins 23B, and the fins 23B extend from the heat conductor 23A.

Coolant cases 24 are provided at respective locations corresponding to the fin members 23, in an outer casing of the housing 21. Each coolant case 24 is comprised of an inner frame 24A and an outer frame 24B fixed to each other, and coolant paths 24C are formed in the inner frame 24A. The coolant supplied from the coolant pipe 5 shown in FIG. 1 flows in the coolant paths 24C.

A thermoelectric conversion module 25 is fixed to the fin member 23 side of the inner frame 24A of each coolant case 24. The thermoelectric conversion module 25 is an element for converting thermal energy into electric energy by making use of the so-called Seebeck effect, as in the first embodiment. This thermoelectric conversion module 25 is in contact with the fin member 23 (through a sheet material) to be kept in a heat conductible state.

A leaf spring 26 is placed between each coolant case 24 and the housing 21. The leaf spring 26 pushes the coolant case 24 toward the fin member 23 by reaction force against the housing 21. The thermoelectric conversion module 25 is urged against the heat conductor 23A of the fin member 23 (through the sheet material) by the elastic force of the leaf spring 26.

Furthermore, an oil receptacle 27 as a heat medium receptacle is formed around the fins 23B in the fin members 23. The oil receptacle 27 can be filled with oil as a heat medium. An oil port 28 and an air port 29 are connected to this oil receptacle 27. The oil enters and leaves the oil receptacle 27 through the oil port 28, and air enters and leaves the oil receptacle 27 through the air port 29. In this connection, air is eliminated in a state in which the oil is in the oil receptacle 27, whereas the oil receptacle 27 is filled with air in a state in which the oil is eliminated out of the receptacle 27.

This oil port 28 is in communication with an oil passage 30 shown in FIG. 5, and the air port 29 in communication with an air passage 31. The oil passage 30 is provided with an oil reservoir 32. While the oil L is not retained in the oil receptacle 27, the oil is stored in this oil reservoir 32. The oil passage 30 and the air passage 31 are connected each to an oil moving piston 33. With movement of the oil moving piston 33, the oil L can be moved between the oil receptacle 27 and the oil reservoir 32. The controller 7 is connected to the oil moving piston 33 and the controller 7 controls the oil moving piston 33.

In the exhaust emission control system with the generator 20 according to the present embodiment having the above configuration, the temperature of the catalyst 9 is estimated based on the temperature signal outputted from the temperature sensor 10, in the same manner as in the first embodiment. In consequence, when the temperature of the catalyst 9 estimated by the controller 7 is not less than the activation temperature, the pump 6 is activated to circulate the coolant in the coolant cases 24 of the generator 20. In conjunction therewith, the controller 7 outputs a control signal to the oil moving piston 33 to activate the oil moving piston 33 so that the oil receptacle 27 in the generator 20 is filled with the oil L, as shown in FIG. 5(a).

When the oil receptacle 27 is filled with the oil L, the heat of the exhaust gas flowing through the exhaust paths 22 is conducted in the high conduction state to the fins 23B. As a result, each thermoelectric conversion module 25 is able to efficiently convert thermal energy into electric energy by making use of the large temperature difference between the fin member 23 and the coolant case 24 (the difference between the temperature of the heat conductor 23A heated by the heat of the exhaust gas through the oil L and the temperature of the inner frame 24A cooled by the coolant). At this time, the heat is re-collected from the exhaust gas flowing to the catalyst 9, to lower the temperature, but the catalyst 9 is already in a highly active state enough to be able to fully demonstrate the cleanup action.

On the other hand, when the temperature of the catalyst 9 is lower than the activation temperature, the controller 7 outputs a stop signal to the pump 6 to deactivate the pump 6. In conjunction therewith, the controller 7 outputs a control signal to the oil moving piston 33 to activate the oil moving piston 33 so that the oil L is removed from the oil receptacle 27 and retained in the oil reservoir 32 and so that the oil receptacle 27 is filled with air, as shown in FIG. 5(b).

While the oil receptacle 27 is filled with air instead of the oil, the air in the oil receptacle 27 interrupts heat conduction from the exhaust gas to the fins 23B during flow of the exhaust gas through the exhaust paths 22. For this reason, heat is hardly conducted from the exhaust gas to the fins 23B, and the exhaust gas flows from the generator 20 to the catalyst 9 while maintaining its high temperature. Therefore, the exhaust gas with large amount of heat is supplied to the catalyst 9, so that the catalyst 9 can reach the activation temperature within a short period of time.

In addition, the pump 6 is stopped to terminate the circulation and supply of the coolant during periods except for heat re-collection periods. This can prevent the system from wasting the power for activation of the pump 6.

As described above, the exhaust emission control system with the generator 20 in the present embodiment is also able to efficiently convert the thermal energy of exhaust gas into electric energy, without slowing the arrival of the catalyst at the activation temperature.

Figure 6:
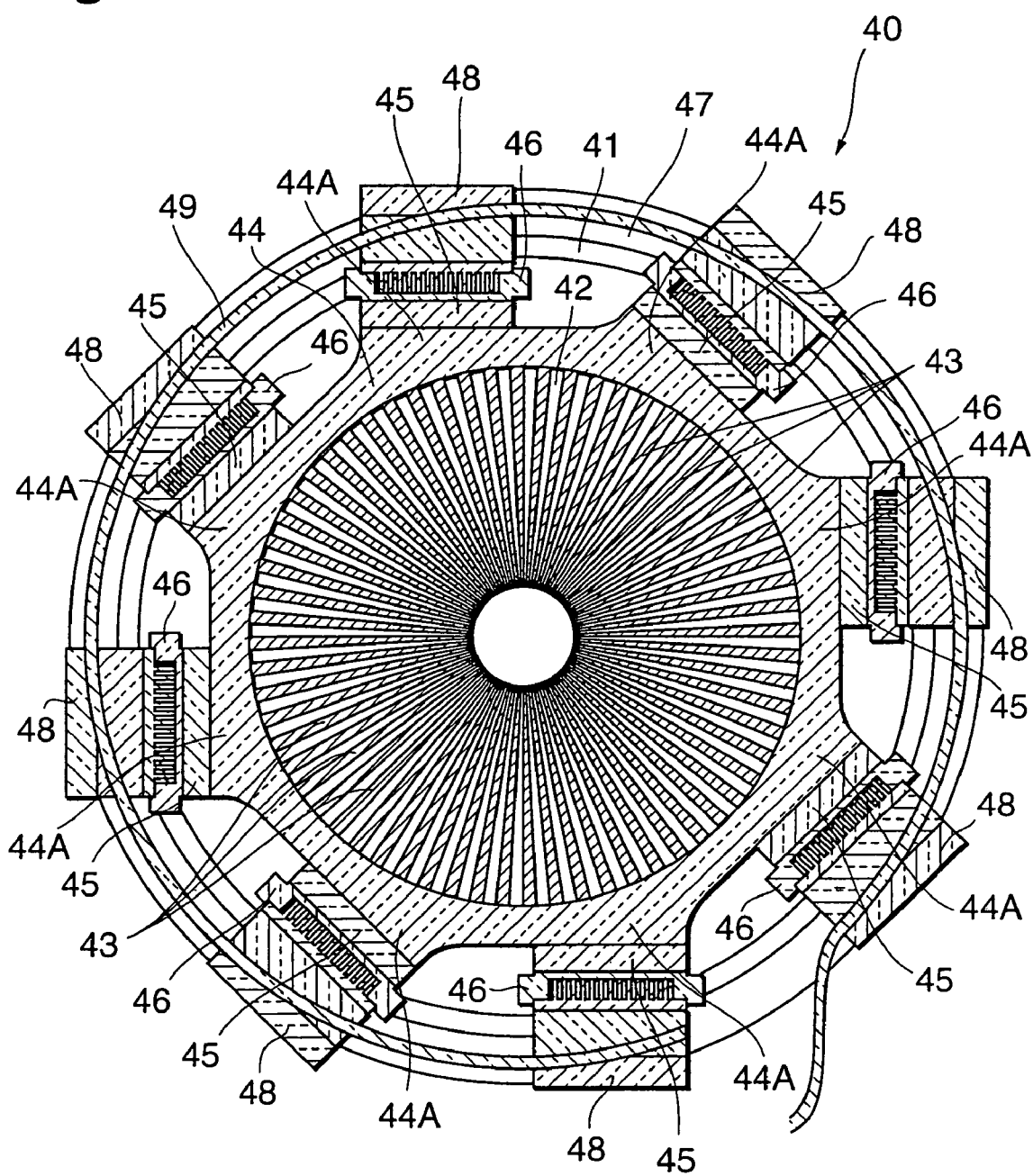
FIG. 6 is a cross-sectional plan view of a generator in an exhaust emission control system according to a third embodiment.
Figure 7:
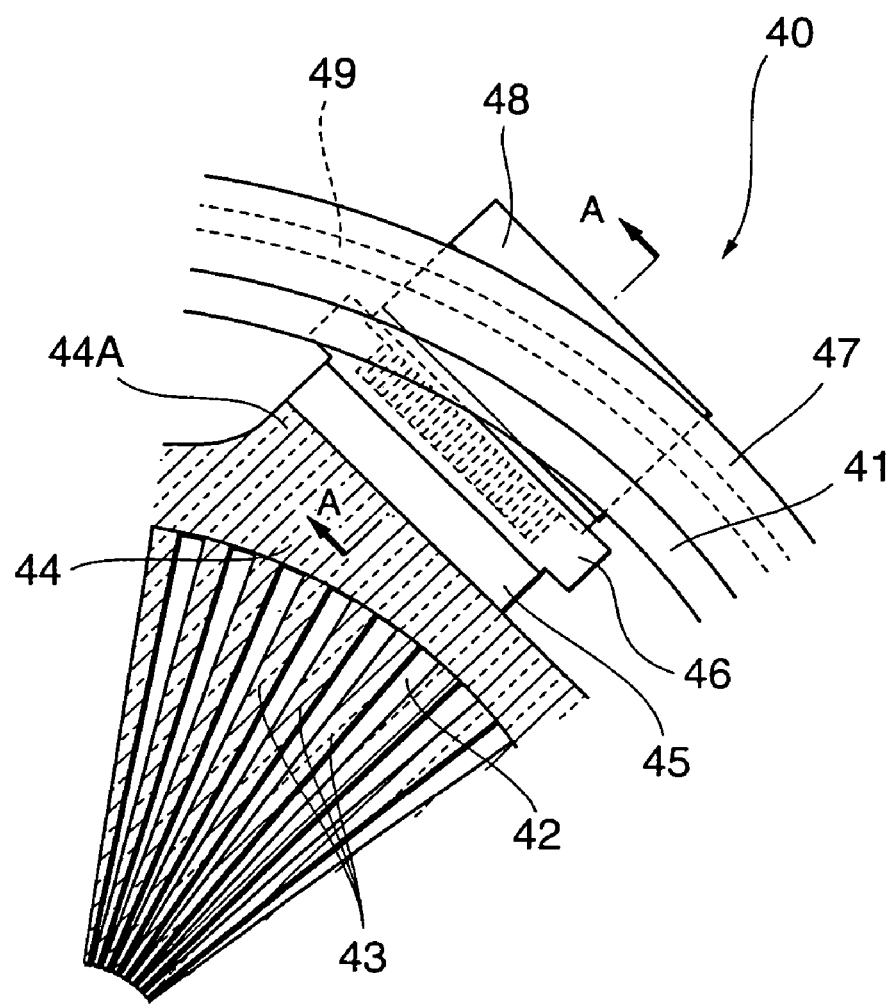
FIG. 7 is an enlarged plan view of a guide member.

The third embodiment of the present invention will be described below. The exhaust emission control system according to the present embodiment is different in the structure of the generator from the first embodiment and has much the same configuration as that shown in FIG. 1, in the other respects. FIG. 6 is a cross-sectional plan view of the generator in the exhaust emission control system of the third embodiment of the present invention, FIG. 7 an enlarged plan view of a guide member, and FIG. 8 a sectional view along line A-A in FIG. 7.

As shown in FIG. 6, the generator 40 in the exhaust emission control system of the present embodiment has a housing 41, and one exhaust path 42 is formed in the central part of the housing 41. The exhaust path 42 is provided with a plurality of fins 43. The fins are mounted on an inner surface of a tubular heat-conducting member 44, and the fins 43 and the heat-conducting member 44 are integrally formed, for example, by extrusion.

Eight heat conductors 44A serving as the heat re-collector of the present invention are formed at equal intervals in the circumferential direction, in the outer peripheral region of the heat-conducting member 44. An outer surface of each heat conductor 44A is formed in flat shape, and this flat surface is arranged at such an angular position that it is offset a little outward from a line extending in the radial direction of an inside section in the heat-conducting member 44.

A thermoelectric conversion module 45 is mounted on each of these heat conductors 44A. The thermoelectric conversion module 45 is an element for converting thermal energy into electric energy by making use of the so-called Seebeck effect, as in each of the above embodiments. While the thermoelectric conversion modules 45 are in contact with the heat conductors 44A of the heat-conducting member 44, the heat of the exhaust gas in the exhaust path 42 is conducted through the heat-conducting member 44 to the thermoelectric conversion modules 45. Coolant cases 46 are mounted on the respective thermoelectric conversion modules 45. Coolant paths are formed in each coolant case 46.

Figure 8:
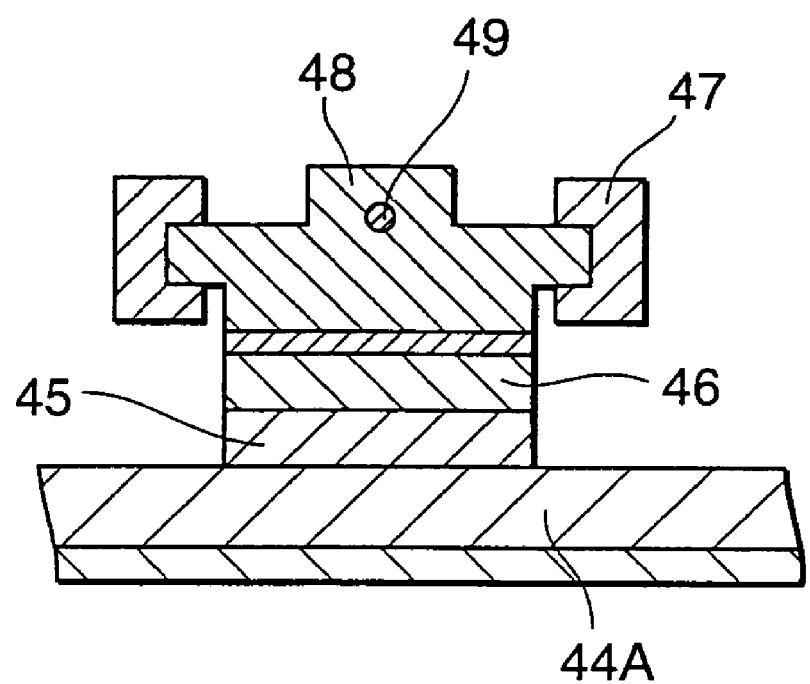
FIG. 8 is a sectional view along line A-A in FIG. 7.

The housing 41 is also provided with rotation rails 47 arranged so as to surround the outside of all the coolant cases 46, and the rotation rails 47 are arranged substantially concentrically with the exhaust path 42 of a circular cross section; i.e., the center of the rotation rails 47 is substantially coincident with the center of the exhaust path 42 of the circular cross section. Furthermore, outside the coolant cases 46, as shown in FIG. 8, guide members 48 capable of sliding along the rotation rails 47 are mounted on the respective cases.

A wire 49 is attached at the central position of each guide member 48 so as to penetrate it. The wire 49 is coupled to all the eight guide members 48 so that the guide members 48 can move along the rotation rails 47 by pulling the wire 49. One end of the wire 49 is connected to an unrepresented actuator, and the wire 49 can be pulled by actuation of the actuator.

Furthermore, each guide member 48 is pushed by an unrepresented spring, and the spring keeps the thermoelectric conversion module 45 in contact with the heat conductor 44A while the wire 49 is not pulled. With actuation of the actuator, the wire 49 is pulled against elastic forces of the springs to move the guide members 48. The controller 7 outputs a control signal to the actuator. The controller outputs the control signal to the actuator, based on the estimated temperature of the catalyst 9.

Figure 9:
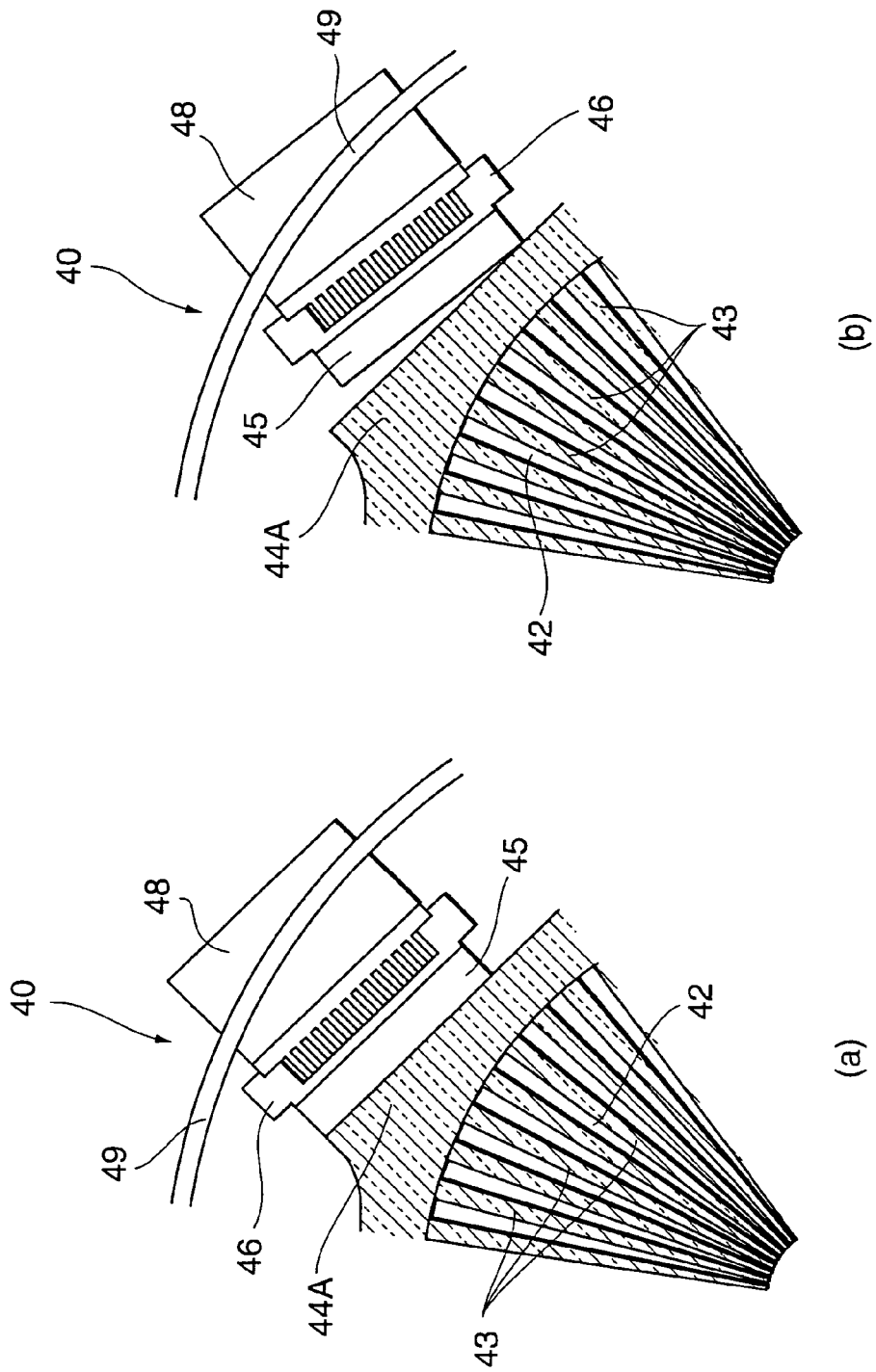
FIG. 9 is a plan view showing states of a thermoelectric conversion module and a heat conductor.

In the exhaust emission control system of the present embodiment having the above configuration, the temperature of the catalyst 9 is estimated based on the temperature signal outputted from the temperature sensor 10, as in the first embodiment. In consequence, when the temperature of the catalyst 9 estimated by the controller 7 is not less than the activation temperature, the pump 6 is activated to circulate the coolant in the coolant cases 46 of the generator 40 in conjunction therewith, the controller 7 keeps the actuator in an inactive state to free the wire 49, and the thermoelectric conversion modules 45 are kept in contact with the heat conductors 44A of the heat-conducting member 44 by the elastic forces of the unrepresented springs, as shown in FIG. 9(a). It is noted that FIG. 9 is depicted without illustration of the rotation rails 47 and housing 41.

As the thermoelectric conversion modules 45 are kept in contact with the heat conductors 44A in this manner, the heat of the exhaust gas flowing in the exhaust path 42 is re-collected by the fins 43 and conducted in the high conduction state to the thermoelectric conversion modules 45. As a result, the thermoelectric conversion modules 45 are able to efficiently convert thermal energy into electric energy by making use of the large temperature difference between the heat-conducting member 44 and the coolant cases 46 (the difference between the temperature of the heat conductors 44A heated by the heat of exhaust gas and the temperature of the coolant cases 46 cooled by the coolant). At this time, the heat is re-collected from the exhaust gas flowing to the catalyst 9, to lower the temperature, but the catalyst 9 is already in a highly active state enough to be able to fully demonstrate the cleanup action.

On the other hand, when the temperature of the catalyst 9 is below the activation temperature, the controller 7 outputs a stop signal to the pump 6 to stop the pump 6. In conjunction therewith, the controller 7 outputs an activation signal to the actuator to actuate the actuator so as to pull the wire 49. When the wire 49 is pulled by the actuator, the guide members 48 move along the rotation rails 47. At this time, since the line passing the center of the rotation rails 47 is offset from the center axis of the guide members 48 (the axis perpendicular to the surface of the thermoelectric conversion modules 45), the pulling action of the wire 49 results in moving the thermoelectric conversion modules 45 away from the heat conductors 44A, as shown in FIG. 9(b).

As the thermoelectric conversion modules 45 are detached from the heat conductors 44A, an air layer is created between the thermoelectric conversion modules 45 and the heat conductors 44A, and the heat of the exhaust gas flowing in the exhaust path 42 is not conducted through the heat-conducting member 44 to the thermoelectric conversion modules 45. Therefore, the exhaust gas flows from the generator 40 to the catalyst 9 while maintaining its high temperature. For this reason, the exhaust gas with large amount of heat is supplied to the catalyst 9, so that the catalyst 9 can reach the activation temperature within a short period of time.

During periods except for heat re-collection periods, the pump 6 is stopped to terminate the circulation and supply of the coolant. This can prevent the system from wasting the power for actuation of the pump 6.

Figure 10:
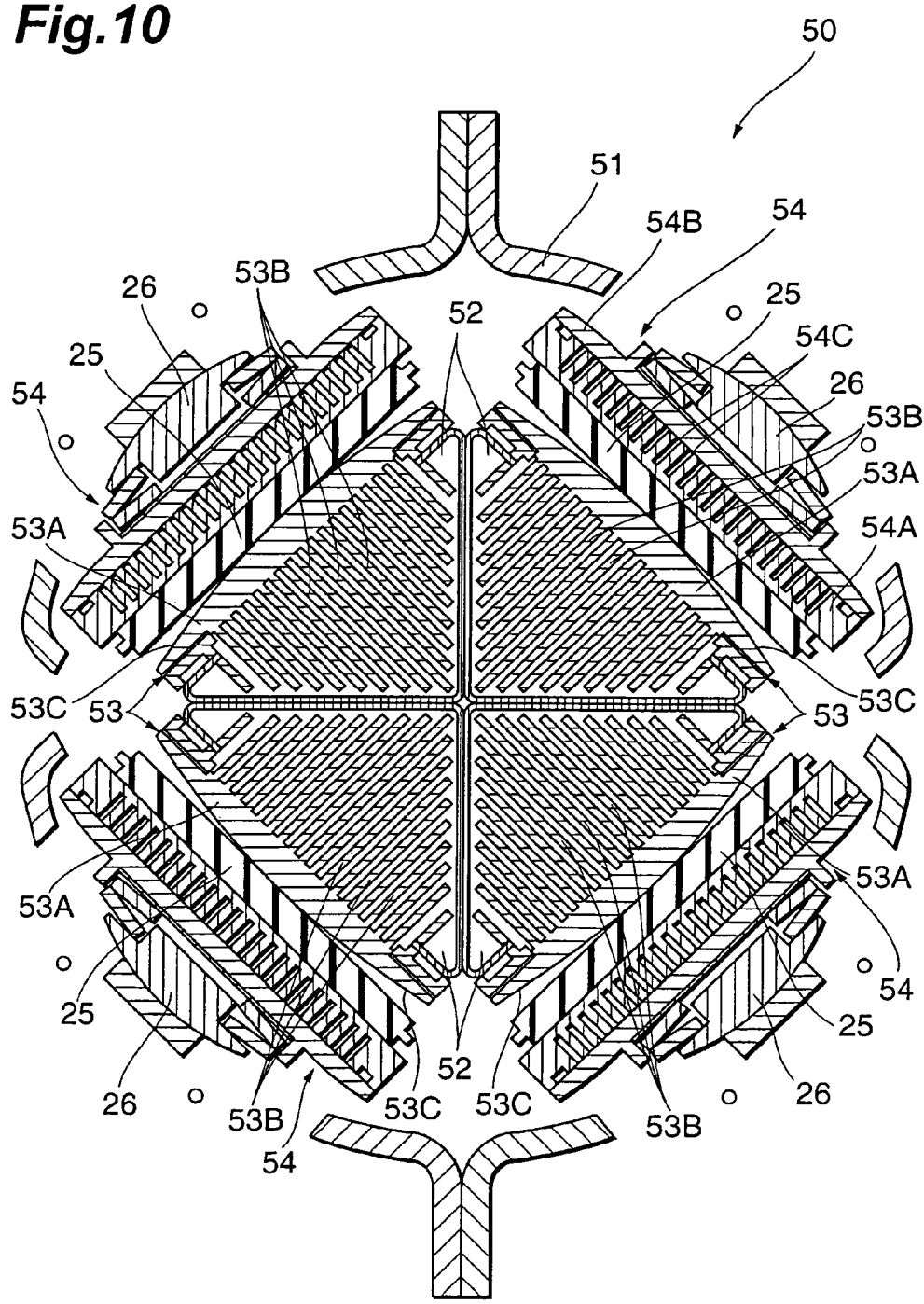
FIG. 10 is a cross-sectional plan view of a generator in an exhaust emission control system according to a fourth embodiment.

The fourth embodiment of the present invention will be described below. The exhaust emission control system of the present embodiment is different in the structure of the generator from the first embodiment and has much the same configuration as that shown in FIG. 1, in the other respects. FIG. 10 is a cross-sectional plan view of the generator in the exhaust emission control system according to the fourth embodiment of the present invention.

As shown in FIG. 10, the generator 50 in the exhaust emission control system of the present embodiment has a housing 51, and four exhaust paths 52 are formed in the housing 51. Each exhaust path 52 is provided with a fin member 53 for re-collecting the thermal energy from the exhaust gas.

Each fin member 53 is comprised of a heat conductor 53A and fins 53B, and the fins 53B extend from the heat conductor 53A. The fins 53B are large in the central region of the heat conductor 53A and decrease their size toward the side edges. A contact surface 53C in contact with the thermoelectric conversion module 25 is formed in a surface without the fins 53B, of each heat conductor 53A.

The heat conductors 53A are deformable by the temperature of the exhaust gas flowing in the exhaust paths 52. Namely, the heat conductors 53A are made of a thermally deformable material. In a state where the generator 50 is not warmed up well and where the temperature of the generator 50 is low, the contact surface 53C contacted with the thermoelectric conversion module 25 is curved, as shown in FIG.

11(a). In a state where the generator 50 is warmed up well and where the temperature of the generator 50 is high, the contact surface 53C contacted with the thermoelectric conversion module 25 is flat, as shown in FIG. 11(b).

Coolant cases 54 are mounted at respective positions corresponding to the fin members 53 in the outer casing of the housing 51, and each coolant case 54 is comprised of an inner frame 54A and an outer frame 54B. The outer frame 54B is fixed to the outer casing of the housing and the inner frame 54A is fixed to the outer frame 54B. Coolant paths 54C are formed in each inner frame 54A, and the coolant supplied from the coolant pipe 5 shown in FIG. 1 flows in the coolant paths 54C.

In the exhaust emission control system of the present embodiment having the above configuration, the temperature of the catalyst 9 is estimated based on the temperature signal outputted from the temperature sensor 10 shown in FIG. 1, as in the first embodiment. In consequence, when the temperature of the catalyst 9 estimated by the controller 7 is not less than the activation temperature, the pump 6 is activated to circulate the coolant in the coolant cases 54 of the generator 50.

In a state in which the temperature of the catalyst 9 is too low to fully demonstrate its cleanup performance, the temperature of the generator 50 is also low. While the temperature of the generator 50 is low, the contact surfaces 53C are curved, as shown in FIG. 11(a). At this time, the fins 53B are nearly parallel to each other. In the curved shape of the contact surfaces 53C, the contact area is small between the contact surfaces 53C and the thermoelectric conversion modules 25. As a result, the thermoelectric conversion modules 25 decrease the quantity of conversion from thermal energy to electric energy so as to feed more heat to the catalyst 9 by that degree, whereby the catalyst 9 can reach the activation temperature within a short period of time. On the other hand, when the catalyst 9 is warmed up to increase the temperature, the generator 50 is also warmed up with the catalyst 9, so that the contact surfaces 53C become nearly flat, as shown in FIG. 11(b). At this time, the fins are deformed so as to expand the spacing between distal ends of adjacent fins 53B.

This deformation of the fin members 53 is attributed to two temperature distributions (temperature differences) in the fin members 53. The first one is the temperature difference between the exhaust path 52 side and the thermoelectric conversion module 25 side in each heat conductor 53A. Out of the temperatures on the exhaust path 52 side and on the thermoelectric conversion module 25 side in the heat conductor 53A, the temperature is higher on the exhaust path 52 side. When the temperature is higher on the exhaust path 52 side, as shown in FIG. 12(a), the exhaust path 52 side in the heat conductor 53A expands more than the thermoelectric conversion module 25 side.

The second temperature distribution is the temperature difference between the fins 53B in the central region of the heat conductor 53A and the fins 53B in the edge regions. The fins 53B in the central region of the heat conductor 53A are larger than those 53B in the edge regions and, also have a larger surface area. For this reason, as shown in FIG. 12(b), the fins 53B in the central region absorb more heat from the exhaust gas than the fins 53B in the edge regions.

These two temperature distributions bend the heat conductor 53A in the fin member 53 wholly toward the thermoelectric conversion module 25, as shown in FIG. 12(c). As a result, the contact surface 53C with the thermoelectric conversion module 25 turns into the shape close to a flat surface.

In this manner, the contact surface 53C of the fin member 53 with the thermoelectric conversion module 25 becomes close to a flat surface, or becomes a flat surface, whereby the contact area increases between the heat conductor 53A of the fin member 53 and the thermoelectric conversion module 25 and whereby the heat in the exhaust gas can be efficiently re-collected by that degree. Namely, the thermoelectric conversion modules 25 are able to efficiently convert thermal energy into electric energy by making use of the large temperature difference between the fin members 53 and the coolant cases 54 (the difference between the temperature of the heat conductors 53A heated by the heat of exhaust gas and the temperature of the inner frames 54A cooled by the coolant).

Figure 13:
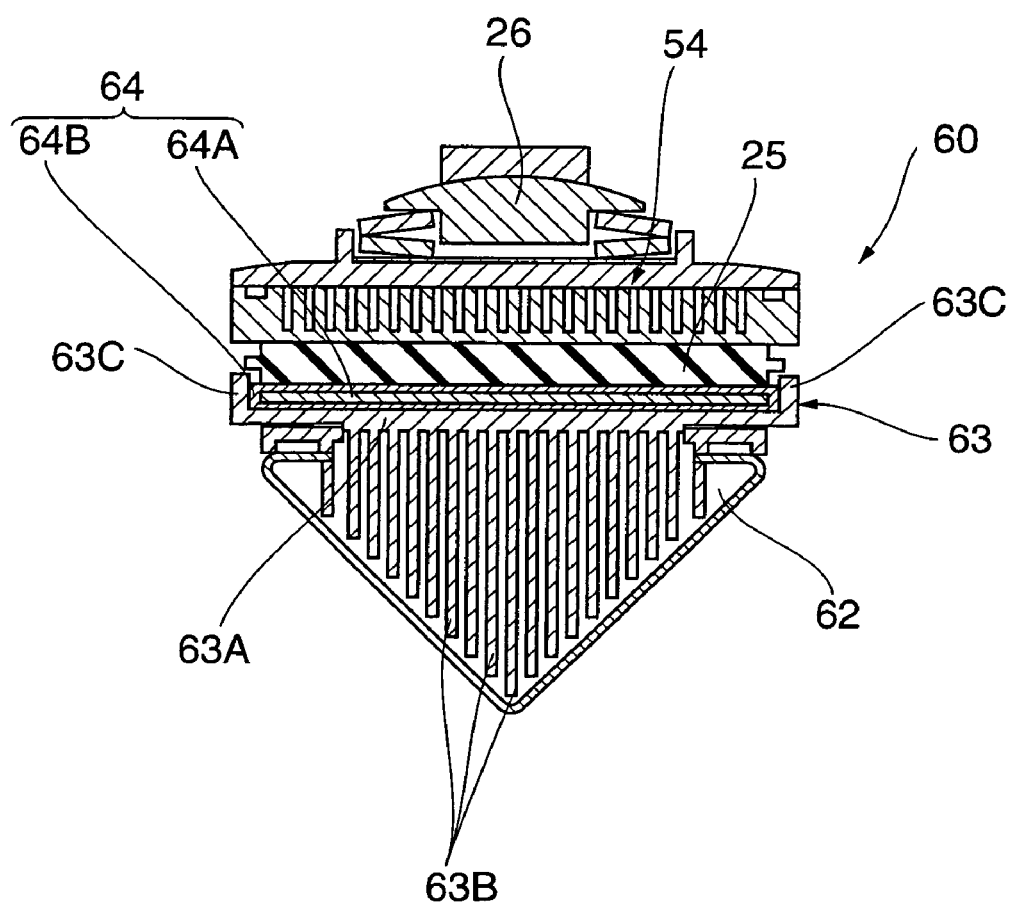
FIG. 13 is a cross-sectional plan view of major part of a generator in an exhaust emission control system according to a fifth embodiment.

The fifth embodiment of the present invention will be described below. The exhaust emission control system of the present embodiment is different in the structure of the generator from the first embodiment and has much the same configuration as that shown in FIG. 1, in the other respects. FIG. 13 is a cross-sectional plan view of major part of the generator in the exhaust emission control system of the present embodiment.

As shown in FIG. 13, the generator 60 in the exhaust emission control system of the present embodiment has exhaust paths 62. The exhaust paths 62 are formed in a housing similar to the housing 51 shown in FIG. 10, which was described in the fourth embodiment. There are four exhaust paths 62 formed in the housing, as in the fourth embodiment.

Each exhaust path 62 is provided with a fin member 63 for re-collecting thermal energy from the exhaust gas. The fin member 63 is comprised of a heat conductor 63A and fins 63B, and the fins 63B extend from the heat conductor 63A. A flange 63C is formed at the side edge of the heat conductor 63A, and a buffer pad 64, which is a hardness change material of the present invention, is provided between the heat conductor 63A and the flange 63C.

The buffer pad 64, as shown in FIG. 14, is comprised of a solder 64A, which is a phase change material, and a flexible case 64B. The solder 64A turns into a solid (solid phase) or into a liquid (liquid phase), depending upon temperatures of the fin member 63 and the thermoelectric conversion module 25. The solder 64A is liquid when the temperatures of the fin member 63 and thermoelectric conversion module 25 are high. The solder 64A is solid when the temperatures of the fin member 63 and thermoelectric conversion module 25 are low. The phase change material can be another metal with a low melting point such as lead, besides the solder.

On the opposite side of the buffer pad 64 to the fin member 63, the thermoelectric conversion module 25 is provided in a contact state. The buffer pad 64 is disposed between the fin member 63 and the thermoelectric conversion module 25 to conduct the heat re-collected by the fin member 63, to the thermoelectric conversion module 25.

In the exhaust emission control system of the present embodiment having the above configuration, the temperature of the catalyst 9 is estimated based on the temperature signal outputted from the temperature sensor 10, as in the first embodiment. In consequence, when the temperature of the catalyst 9 estimated by the controller 7 is not less than the activation temperature, the pump 6 is actuated to circulate the coolant in the coolant cases 54 of the generator 60.

In a state in which the temperature of the catalyst 9 is too low to fully demonstrate its cleanup performance, the temperature of the generator 60 is also low. Here the solder 64A in the buffer pad 64 is solid and, as shown in FIG. 14(a), the solder 64A is massive. For this reason, a clearance is made between the buffer pad 64 and the fin member 63, so that the contact area between the buffer pad 64 and the fin member 63 is very small.

When the solder 64A is solid to keep the contact area small between the buffer pad 64 and the fin member 63, the thermoelectric conversion module 25 decreases the amount of conversion from thermal energy into electric energy, so that more heat can be fed to the catalyst 9 by that degree. Therefore, more heat can be supplied to the catalyst 9 before warmed up, whereby the catalyst 9 can reach the activation temperature within a short period of time.

On the other hand, in a state in which the temperature of the catalyst 9 is high enough to fully demonstrate its cleanup performance, the temperature of the generator 60 is also high. At this time, the solder 64A in the buffer pad 64 is liquid and, as shown in FIG. 14(b), the solder 64A becomes flowable. When the solder 64A becomes deformable, the buffer pad 64 follows a change of the shape of the fin member 63 even if the fin member 63 is deformed by heat. Therefore, the large contact area can be maintained between the buffer pad 64 and the fin member 63.

At this time, since the catalyst 9 is fully warmed up, the amount of heat for the warmup of the catalyst 9 is not necessary, and more thermal energy can be converted into electric energy. Since the solder 64A is liquid herein to increase the contact area between the buffer pad 64 and the fin member 63, the thermal energy can be efficiently converted into electric energy by making use of the large temperature difference between the fin member 63 and the coolant case 54 (the difference between the temperature of the buffer pad 64 to which the heat of the fin member 63 is fully conducted, and the temperature of the coolant case 54 cooled by the coolant).

Figure 15:
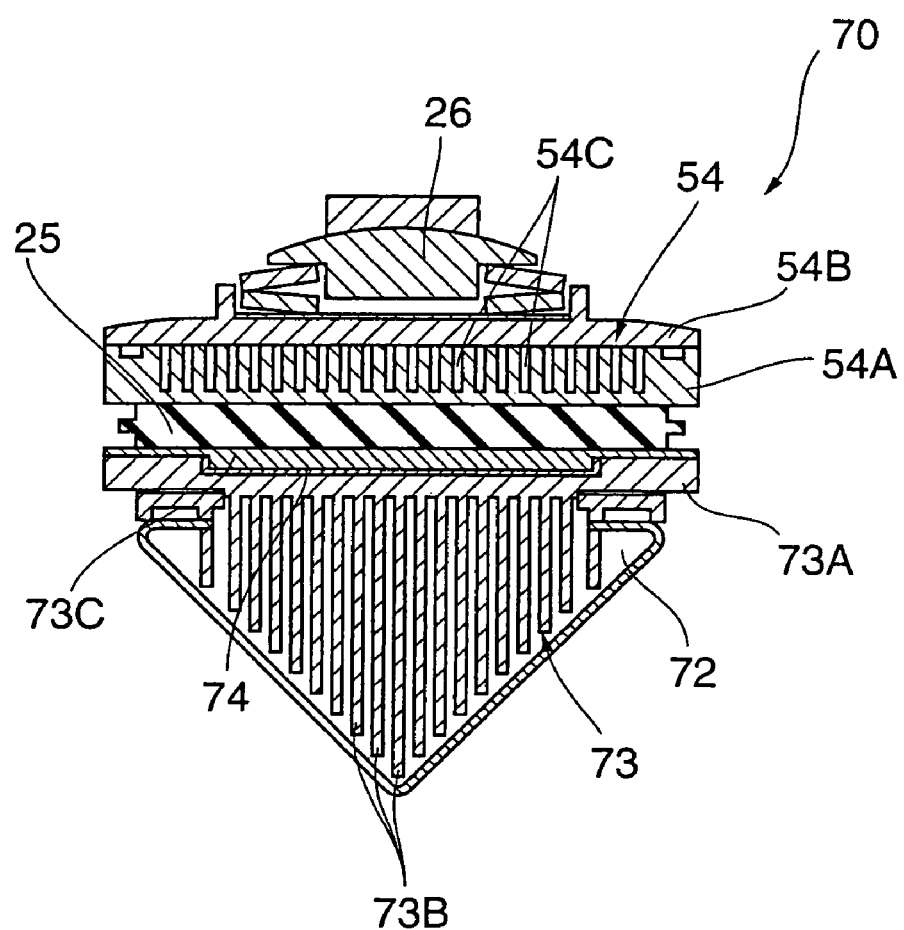
FIG. 15 is a cross-sectional plan view of major part of a generator in an exhaust emission control system according to a sixth embodiment.

The sixth embodiment of the present invention will be described below. The exhaust emission control system of the present embodiment is different in the structure of the generator from the first embodiment and has much the same configuration as that shown in FIG. 1, in the other respects. FIG. 15 is a cross-sectional plan view of major part of the generator in the exhaust emission control system of the present embodiment.

As shown in FIG. 15, the generator 70 in the exhaust emission control system of the present embodiment has exhaust paths 72. The exhaust paths 72 are formed in a housing similar to the housing 51 shown in FIG. 10 described in the fourth embodiment. There are four exhaust paths 72 formed in the housing, as in the fourth embodiment.

Each exhaust path 72 is provided with a fin member 73 for re-collecting the thermal energy from the exhaust gas. The fin member 73 is comprised of a heat conductor 73A and fins 73B, and the fins 73B extend from the heat conductor 73A. A recess is formed in a surface of the heat conductor 73A where the fins 73B are not provided, and a lid member 73C for closing this recess is fixed to the surface.

A solder 74 as a phase change material is enclosed in the recess formed in the heat conductor 73A. A thermoelectric conversion module 25 is mounted on a surface of the lid member 73C opposite to the heat conductor 73A side. A coolant case 54 is mounted on a surface of the thermoelectric conversion module 25 on the opposite side to the fin member 73.

In the exhaust emission control system of the present embodiment having the above configuration, the temperature of the catalyst 9 is estimated based on the temperature signal outputted from the temperature sensor 10, as in the first embodiment. In consequence, when the temperature of the catalyst 9 estimated by the controller 7 is not less than the activation temperature, the pump 6 is actuated to circulate the coolant in the coolant cases 54 of the generator 70.

When the temperature of the catalyst 9 is too low to fully demonstrate its cleanup performance, the temperature of the generator 70 is also low. At this point, the solder 74 enclosed in the recess of the heat conductor 73A is solid. Since the solid solder 74 includes a lot of voids of bubbles, this solder 74 keeps the heat conduction rate low from the fin member 73 to the thermoelectric conversion module 25 while being interposed between the fin member 73 and the thermoelectric conversion module 25.

As the heat conduction rate is low from the fin member 73 to the thermoelectric conversion module 25, less heat is lost from the exhaust gas and more heat can be supplied to the catalyst 9 by that degree. Accordingly, more heat can be supplied to the catalyst 9 before warmed up, whereby the catalyst 9 can reach the activation temperature within a short period of time.

On the other hand, in a state in which the temperature of the catalyst 9 is high enough to fully demonstrate its cleanup performance, the temperature of the generator 60 is also high. At this time, the solder 74 is liquid and flowable. The solder 74 in a deformable state improves the contact with the fin member 73, so as to increase the heat conduction from the fin member 73 to the thermoelectric conversion module 25. Particularly, since the solder 74 has flowability, the solder can follow a change of the shape of the fin member even if the fin member 73 is deformed by heat; therefore, the high heat conduction can be maintained.

Since at this time the catalyst 9 is already in a fully warmed state, the amount of heat for the warmup of the catalyst 9 is not necessary and more thermal energy can be converted into electric energy. Since the solder 74 is liquid herein to increase the thermal conduction to the thermoelectric conversion module 25, the thermal energy can be efficiently converted into electric energy by making use of the large temperature difference between the fin member 73 and the coolant case 54 (the difference between the temperature of the lid member 73C to which the heat of the fins 73B is fully conducted through the solder 74, and the temperature of the inner frame 54A cooled by the coolant).

The exhaust emission control systems according to the present invention are able to efficiently re-collect the thermal energy of exhaust gas and convert it into electric energy, without increase in the time to the arrival of the catalyst at the activation temperature.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An exhaust emission control system, comprising:
   a generator having a thermoelectric conversion element for achieving thermoelectric conversion by use of heat of exhaust gas;
   an exhaust purifying catalyst disposed in the generator or on the exhaust downstream of the generator; and
   heat conduction varying means for making heat conduction from the exhaust gas to the thermoelectric conversion element variable between a high conduction state and a low conduction state,
   wherein when a temperature of the exhaust purifying catalyst is higher than a predetermined temperature, the heat conduction varying means varies the heat conduction from the exhaust gas to the thermoelectric conversion element into the high conduction state;
   wherein the thermoelectric conversion element is arranged movable along the periphery of the heat re-collector and is selectively controlled to be in contact with or to be detached from the heat re-collector, depending upon moving locations thereof, and wherein the heat conduction varying means brings the thermoelectric conversion element into contact with the heat re-collector to achieve the high conduction state, and wherein the heat conduction varying means detaches the thermoelectric conversion element from the heat re-collector to achieve the low conduction state;

and wherein the thermoelectric conversion element is pulled so that the thermoelectric conversion element is rotated relative to the heat re-collector around a fulcrum at one end of the thermoelectric conversion element, whereby the thermoelectric conversion element is detached from the exhaust path.

2. An exhaust emission control system, comprising:

a generator having a thermoelectric conversion element for achieving thermoelectric conversion by use of heat of exhaust gas;

an exhaust purifying catalyst disposed in the generator or on the exhaust downstream of the generator; and heat conduction varying means for making heat conduction from the exhaust gas to the thermoelectric conversion element variable between a high conduction state and a low conduction state, wherein when a temperature of the exhaust purifying catalyst is higher than a predetermined temperature, the heat conduction varying means varies the heat conduction from the exhaust gas to the thermoelectric conversion element into the high conduction state;

wherein the heat conduction varying means comprises a heat re-collector for re-collection of the heat of the exhaust gas, wherein a contact surface of the heat re-collector with the thermoelectric conversion element is thermally deformable, and wherein with increase in heat of the heat re-collector, a contact area of the contact surface with the thermoelectric conversion element increases, wherein the contact surface is a flat surface when the contact area is large, and wherein the contact surface is a curved surface when the contact area is small.

3. An exhaust emission control system, comprising:

a generator having a thermoelectric conversion element for achieving thermoelectric conversion by use of heat of exhaust gas;

an exhaust purifying catalyst disposed in the generator or on the exhaust downstream of the generator; and heat conduction varying means for making heat conduction from the exhaust gas to the thermoelectric conversion element variable between a high conduction state and a low conduction state, wherein when a temperature of the exhaust purifying catalyst is higher than a predetermined temperature, the heat conduction varying means varies the heat conduction from the exhaust gas to the thermoelectric conversion element into the high conduction state;

wherein the heat conduction varying means comprises a heat re-collector for re-collection of the heat of the exhaust gas, wherein a hardness change material is placed between the heat re-collector and the thermoelectric conversion element, wherein the high conduction state is achieved when the hardness change material is soft, and wherein the low conduction state is achieved when the hardness change material is hard;

wherein the hardness change material is formed by retaining a phase change material in a flexible case.

* * * * *